(12) United States Patent
Liu et al.

(10) Patent No.: US 9,274,657 B2
(45) Date of Patent: Mar. 1, 2016

(54) SELF-CAPACITIVE TOUCH PANEL

(71) Applicant: MStar Semiconductor, Inc., Hsinchu Hsien (TW)

(72) Inventors: Chun-Chen Liu, Hsinchu County (TW); Meng-Che Tsai, Hsinchu County (TW)

(73) Assignee: MSTAR SEMICONDUCTOR, INC., Hsinchu Hsien (TW), `

( * ) Notice: Subject to any disclaimer, the term of this patent is extended or adjusted under 35 U.S.C. 154(b) by 144 days.

(21) Appl. No.: 13/949,542

(22) Filed: Jul. 24, 2013

(65) Prior Publication Data

US 2014/0028334 A1    Jan. 30, 2014

(30) Foreign Application Priority Data

Jul. 25, 2012    (TW) .............................. 101126736 A

(51) Int. Cl.
  *G06F 3/044*    (2006.01)
  *G01R 27/26*    (2006.01)

(52) U.S. Cl.
  CPC ............ *G06F 3/044* (2013.01); *G01R 27/2605* (2013.01)

(58) Field of Classification Search
  CPC .............................. G01R 27/605; G06F 3/044
  See application file for complete search history.

(56) References Cited

U.S. PATENT DOCUMENTS

| | | | | |
|---|---|---|---|---|
| 4,087,625 A | * | 5/1978 | Dym et al. ................. | 178/18.06 |
| 4,659,874 A | * | 4/1987 | Landmeier ................ | 178/18.03 |
| 6,297,811 B1 | * | 10/2001 | Kent et al. ..................... | 345/173 |
| 8,928,603 B2 | * | 1/2015 | Han et al. ................ | G06F 3/044 |
| | | | | 178/18.01 |
| 9,086,766 B2 | * | 7/2015 | Hsieh ..................... | G06F 3/044 |
| 2008/0252608 A1 | * | 10/2008 | Geaghan ..................... | 345/173 |
| 2012/0105371 A1 | * | 5/2012 | Hotelling et al. ..... | G06F 3/0416 |
| | | | | 345/174 |
| 2012/0169626 A1 | * | 7/2012 | Hsieh ..................... | G06F 3/044 |
| | | | | 345/173 |

FOREIGN PATENT DOCUMENTS

TW        201101161 A      1/2011

OTHER PUBLICATIONS

Taiwan Intellectual Property Office, "Office Action", Apr. 11, 2014.

* cited by examiner

*Primary Examiner* — Alesa Allgood
(74) *Attorney, Agent, or Firm* — WPAT, PC; Justin King

(57) ABSTRACT

A self-capacitive touch panel including a border region and a central region is provided. The border region has a first area and corresponds to a P number of first sensors. The central region has a second area and corresponds to a Q number of second sensors. A ratio of P to the first area is greater than a ratio of Q to the second area.

2 Claims, 8 Drawing Sheets

SELF-CAPACITIVE TOUCH PANEL

This application claims the benefit of Taiwan application Serial No. 101126736, filed Jul. 25, 2012, the subject matter of which is incorporated herein by reference.

BACKGROUND OF THE INVENTION

1. Field of the Invention

The invention relates in general to a touch system, and more particularly, to a technique for enhancing the accuracy in sensing results of a border region of a touch panel.

2. Description of the Related Art

Operating interfaces of recent electronic products are becoming increasingly user-friendly and intuitive. For example, through a touch screen, a user can directly interact with applications as well as input messages/texts/patterns with fingers or a stylus, thus eliminating complications associated with other input devices such as a keyboard or buttons. In practice, a touch screen usually comprises a touch panel and a display provided at the back of the touch panel. According to a touch position on the touch panel and a currently displayed image on the display, an electronic device determines an intention of the touch to execute corresponding operations.

Existing capacitive touch sensing techniques can be roughly categorized into self-capacitive and mutual-capacitive types. Compared to mutual-capacitive touch panels, self-capacitive touch panels can be implemented through a single-layer electrode with a simpler manufacturing process and lower costs, and thus prevail in many entry-level electronic products.

FIG. 1 shows an exemplary self-capacitive touch panel. A sensing area 100 demarcated by a dotted frame includes multiple electrodes, e.g., electrodes 11, 12, 14, 15 and 17. The electrodes are equal in width, and appear similar to right triangles. Since a sensor for sensing capacitance change in the electrodes is expensive, current touch panels are generally designed to have multiple electrodes sharing a same sensor in order to be cost-effective. As shown in FIG. 1, the electrodes 11 and 12 are connected to a first upper sensor 13, and the electrodes 14 and 15 are connected to a first lower sensor 16. In other words, the capacitance change sensed by the first upper sensor 13, rather than being capacitance change of either of the electrodes 11 and 12, is a sum of the capacitance changes occurring at the electrodes 11 and 12. In FIG. 1, the capacitance changes sensed by 2*N number of sensors (N number of upper sensors and N number of lower sensors, each having a designated number and serves as an $i^{th}$ sensor, where i=1 to 2N) are transmitted to a controller (not shown) for the controller to determine a position of a user touch. The controller may calculate an X-coordinate x of the user touch position according to the equation below:

$$x = \frac{\sum_{i=1}^{2N}(C_i * X_i)}{\sum_{i=1}^{2N} C_i} \qquad \text{equation (1)}$$

In equation (1), i is an integral index ranging from 1 to 2N, $C_i$ represents the capacitance change sensed by the $i^{th}$ sensor, and $X_i$ represents coordinates of a common center of gravity of the electrodes connected to the $i^{th}$ sensor. Taking the first upper sensor 13 as an example, the corresponding coordinates $X_i$ of a center of gravity are a position of a common center of gravity of the two electrodes 11 and 12 (between the electrodes 11 and 12).

The controller may further calculate a Y-coordinate y of the user touch position according to the equation below:

$$y = \left(\frac{r * C_U - C_D}{r - 1}\right) * \left(\frac{L}{C_T}\right) \qquad \text{equation (2)}$$

In equation (2), r represents a predetermined value associated with a size of the electrodes, $C_U$ represents a total capacitance change sensed by the N upper sensors, $C_D$ represents a total capacitance change sensed by the N lower sensors, $C_T$ is a sum of $C_U$ and $C_D$, and L represents a height with respect to the Y direction. As shown in FIG. 2, the electrodes are in fact tall and narrow trapezoids with an upper side having a width dxs and a lower side having a width dxl. The value r is defined as:

$$r \equiv \frac{dxl + 0.9 * dxx}{dxs + 0.9 * dxx} \qquad \text{equation (3)}$$

In equation (3), dxx represents a width of a gap between every two adjacent electrodes.

However, the touch panel in FIG. 1 encounters a great challenge—errors in the sensing results of the left and right borders are extremely large. The electrodes 11, 12, 14, 15 and 17 are again depicted in FIGS. 3A to 3C to explain reasons behind such problem.

When a user touch takes places at a position within a dotted circle 21 in FIG. 3A, only the electrode 14 is affected, meaning that only the first lower sensor 16 senses the capacitance change. However, substantially errors exist in the coordinates x and y calculated based on the capacitance change sensed by the first lower sensor 16. It is seen from equation (2) that, a dominant basis for determining the coordinate y is a relation between the two capacitance changes $C_U$ and $C_D$. When only the electrode 14 is affected, the capacitance change $C_U$ is zero regardless of what the Y coordinate of the user touch position is, such that the coordinate y obtained according to equation (2) is a negative value. It is obvious that the above calculation does not correctly respond the Y coordinate of the touch position.

On the other hand, although the capacitance change sensed by the first lower sensor 16 is chiefly contributed by the electrode 14, instead of utilizing the center of gravity of the electrode 14, the controller however utilizes the position of the common center of gravity (denoted as P1) of the electrodes 14 and 15 to represent the position corresponding to the capacitance change sensed by the first lower sensor 16. Accordingly, the coordinate x obtained is slightly shifted to the right from the actual position of the circle 21. Referring to FIG. 3B, when the circle 21 is not located within the border region of the sensing area 100, the left half of the circuit 21 theoretically triggers another electrode 31 (a virtual electrode represented by a dotted triangle), to further provide a capacitance change that shifts a coordinate x calculated according to equation (1) to the left (i.e., a real X coordinate making the coordinate x closer to the circle 21). In other words, in the border region, due to the lack of a balancing value contributed by the virtual electrode 31, and the foregoing center of gravity P1 is located by a great distance from the real X coordinate of the circle 21, the coordinate x calculated by the controller may consequently contain a substantial error.

Similarly, when a user touch takes place at a position within a dotted circle 22 in FIG. 3C (i.e., the rightmost of the sensing area 100), only the electrode 17 is affected. Under the circumstances, only the $N^{th}$ upper sensor senses the capacitance change, such that a substantially error also exists in the coordinates of the touch position calculated accordingly. It is seen from equation (2) that, when only the electrode 17 is affected, the capacitance change $C_D$ is zero regardless of what the Y coordinate of the user touch position is, such that the coordinate y obtained according to equation (2) is a constant value approximating L. It is obvious that the above calculation approach does not correctly represent the actual touch position.

The above issue of sensing errors in the border regions likely leads the controller to misjudge a real intention of a user touch to further trigger incorrect operation result. However, if the left and right border regions of the sensing area 100 are neglected to avoid the above issue, hardware costs are wasted.

SUMMARY OF THE INVENTION

The invention is directed to a novel self-capacitive touch panel, which provides a sensing result having preferred accuracy over the prior art by increasing the number of sensors that may be triggered when a user touches a border region of the touch panel.

According to an embodiment the present invention, a self-capacitive touch panel is provided. The self-capacitive touch panel includes a P number of first sensors, a Q number of second sensors, a border region and a central region. The border region has a first area, and corresponds to the P number of first sensors. The P number of first sensors are configured to sense a capacitance change corresponding to the border region. The central region has a second area, and corresponds to the Q number of second sensors. The Q number of second sensors are configured to sense a capacitance change corresponding to the central area. A ratio of P to the first area is greater than a ratio of Q to the second area.

According to another embodiment of the present invention, a self-capacitive touch panel is provided. The self-capacitive touch panel includes a plurality of sensors, a border region and a central region. Each unit area of the border region includes an R number of electrodes, and corresponds to a P number of first sensors among the plurality of sensors. Each unit area of the central region includes an M number of electrodes, and corresponds to a Q number of second sensors among the plurality sensors. A ratio of R to P is greater than a ratio of M to Q.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 4:
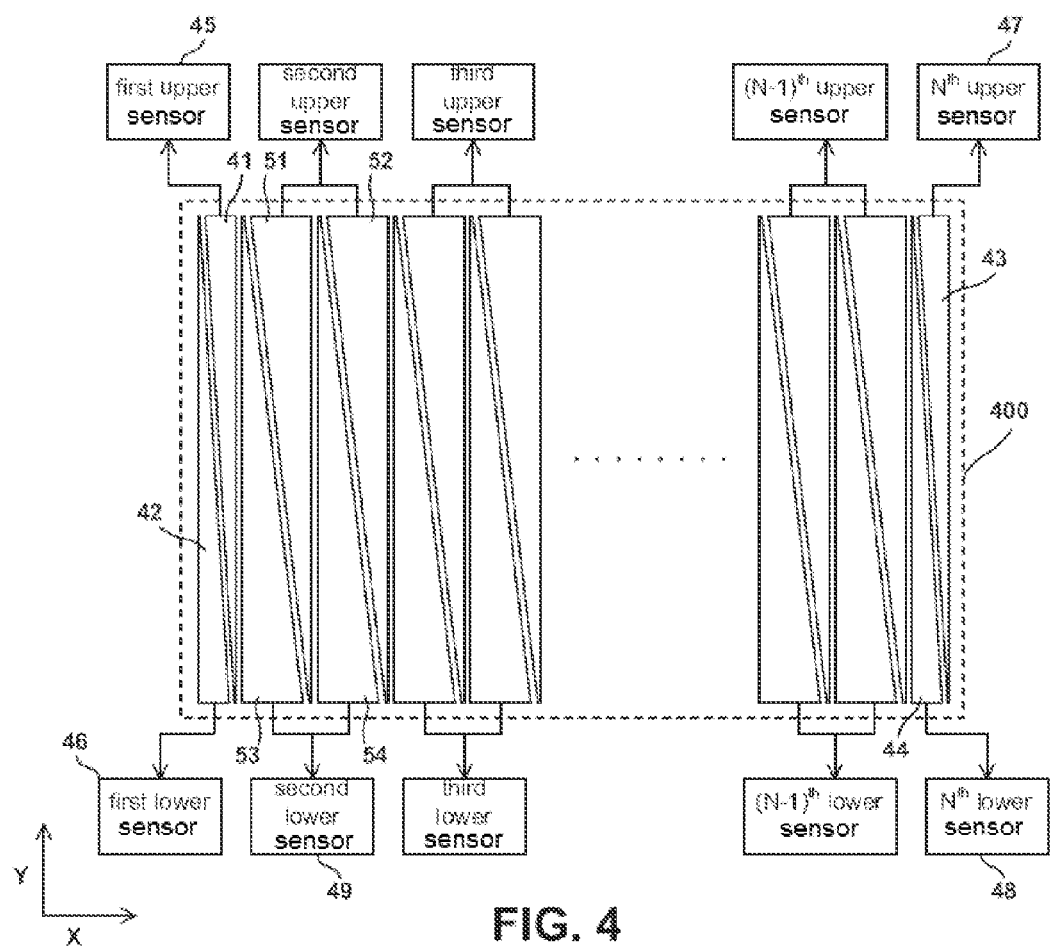
FIG. 4 is an exemplary electrode/sensor arrangement according to an embodiment of the present invention.

FIG. 4 shows a function block diagram of a self-capacitive touch panel according to an embodiment of the present invention. Multiple electrodes appearing similar to right triangles are provided within a sensing area 400 demarcated by a dotted frame. In practice, the shapes of the electrodes may be identical to the tall and narrow trapezoids as shown in FIG. 2. Referring to FIG. 4, in the sensing area 400, leftmost border electrodes 41 and 42 as well as rightmost border electrodes 43 and 44 are narrower than other electrodes (e.g., electrodes 51, 52, 53 and 54) in a central region. In other words, distinct from the prior art shown in FIG. 1, not all the electrodes in this embodiment are equal in width. The border electrodes 41, 42, 43 and 44 are similar to a first right triangle, whereas other electrodes are similar to a second right triangle. The shortest side (parallel to the X direction in the diagram) of the first right triangle is shorter than the shortest side of the second right triangle; the second shortest side (parallel to the Y direction in the diagram) of the first right triangle has a same length as that of the second right triangle.

It is also seen from FIG. 4 that, a first upper sensor 45 is dedicated for sensing the capacitance change of the border electrode 41, a first lower sensor 46 is dedicated for sensing the capacitance change of border electrode 42, an $N^{th}$ upper sensor 47 is dedicated for sensing the capacitance change of the border electrode 43, and an $N^{th}$ lower sensor 48 is dedicated for sensing the capacitance change of the border electrode 44. Moreover, every two electrodes in the central region share a same sensor. The self-capacitive touch panel may further include a controller (not shown) for determining a touch position according to sensing results of the sensors.

With reference to the electrodes 41, 42, and 51 to 54 again depicted in FIG. 5, details for obtaining preferred accuracy in the sensing results of the border regions according to the embodiment over the prior art are explained below. For easy comparison, it is assumed that the electrode 51 in FIG. 5 has a width which is substantially the same as that of the electrode 11 in the X direction.

Figure 3A:
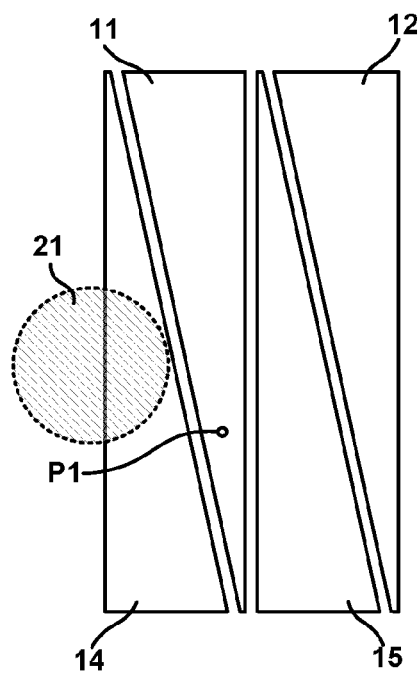
FIGS. 3A to 3C are for explaining a reason causing a large sensing error in a border region in a conventional touch panel.
Figure 3B:
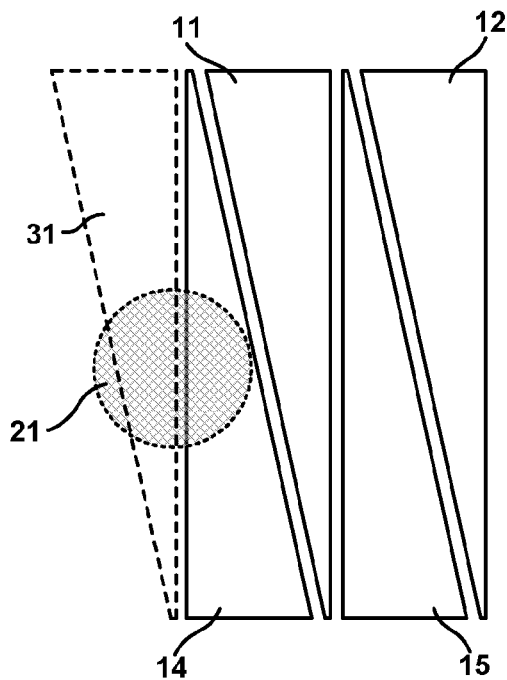
Figure 3C:
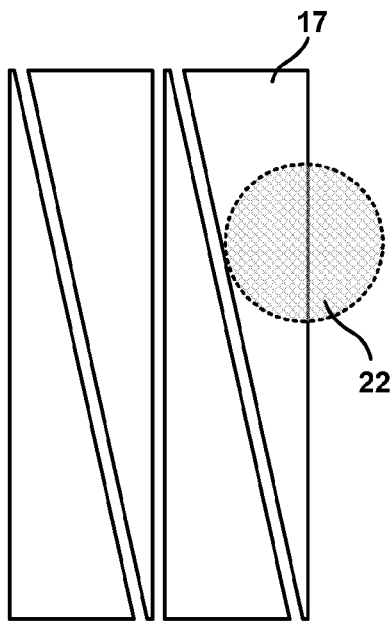
Figure 5:
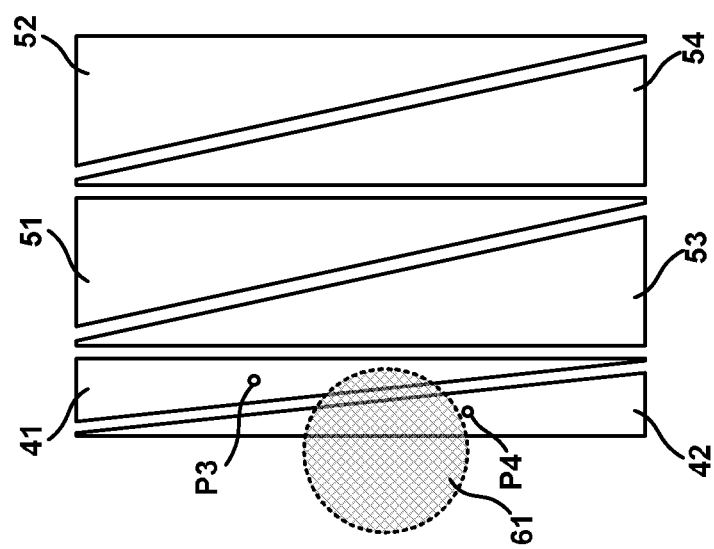
FIG. 5 is for explaining details for enhancing positioning accuracy according to the embodiment.

When a user touch takes places at a position within a dotted circle 61 in FIG. 5 (the position of the circle 21 in FIG. 3A), different from a situation shown in FIG. 3A, where only the electrode 14 is affected, the electrodes 41 and 42 are both affected as the electrodes 41 and 42 are narrower. Thus, sensing results generated by the first upper sensor 45 and the first lower sensor 46 are both provided for calculating the Y coordinate of the circle 61. In other words, neither the capacitance change $C_U$ nor the capacitance change $C_D$ is zero. It is concluded that, compared to the arrangement of the electrodes/sensors in FIG. 1, the arrangement of the electrodes/sensors in FIG. 4 offers a more accurate coordinate y when a user touch similarly takes place at a border position of the circle 61.

When determining the X coordinate of the circle 61 according to equation (1), the controller utilizes the center of gravity (denoted as P3) of the electrode 41 to represent a position at which the capacitance change is sensed by the first upper sensor 45, and utilizes the center of gravity (denoted as P4) of the electrode 42 to represent a position at which the capacitance change is sensed by the lower first sensor 46. In the X direction, the positions of the centers of gravity P3 and P4 are quite close to the circle 61. Therefore, compared to the situation depicted in FIG. 3A, the coordinate x calculated and obtained by the controller in this embodiment is closer to the actual X coordinate of the circle 61. More specifically, the more accurate coordinate x obtained from the arrangement of the electrodes/sensors in FIG. 4 is contributed by a smaller average distance between the center of gravity of each of the border electrodes and all possible touch points in the corresponding electrode. Comparing the center of gravity P4 in FIG. 5 and the center or gravity P1 in FIG. 3A, in average, the capacitance change sensed by the first lower sensor 46 and represented by the X coordinate of the center of gravity P4 more realistically reflects the actual touch position than the capacitance change sensed by the first lower sensor 16 and represented by the X coordinate of the center of gravity P1.

Figure 1:
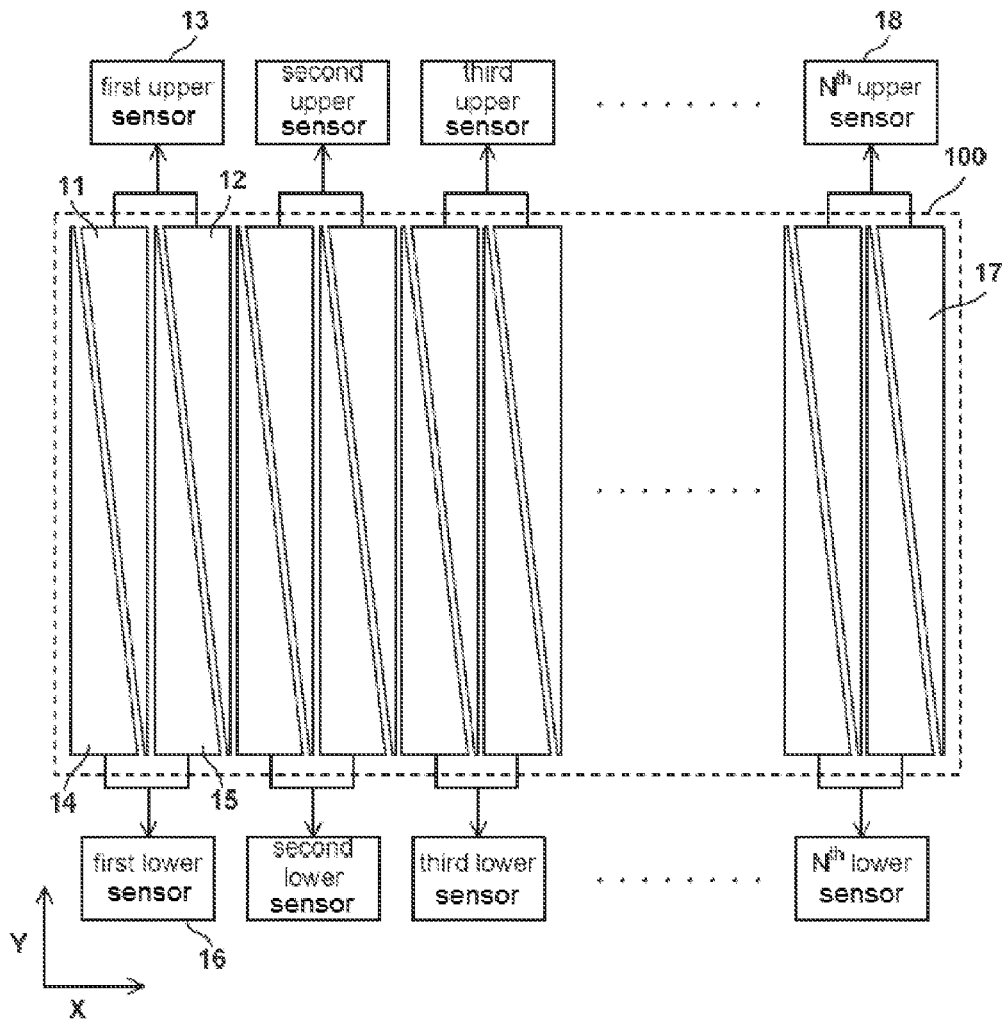
FIG. 1 is an example of a conventional self-capacitive touch panel.
Figure 2:
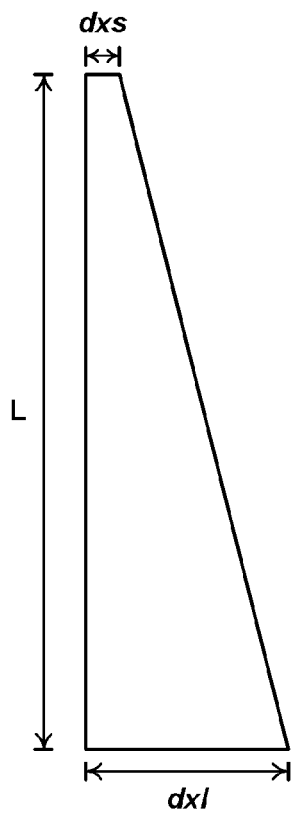
FIG. 2 is an example of a trapezoid electrode pattern.

It should be noted that, the total number of sensors in FIG. 4 may be the same as the total number of sensors in FIG. 1. In practice, by slightly increasing the X-direction width of the electrodes in the central region (e.g., the electrodes 51, 52, 53 and 54), the size of the sensing area 400 can be maintained the same as that of the sensing area 100. From another perspective, given the size of the sensing area 400 and the total number of sensors, the widths of the electrodes in the central region and the border region can be calculated with the ratio of the electrodes in the two regions.

It should be noted that, when calculating the touch position by the controller included in or cooperating with the self-capacitive touch panel, the coordinates x and y can be calculated by other approaches apart from the foregoing equations (1), (2) and (3). In other words, the concept of the present invention is not limited to a self-capacitive touch panel that determines a touch position according to the equations (1), (2) and (3).

Figure 6:
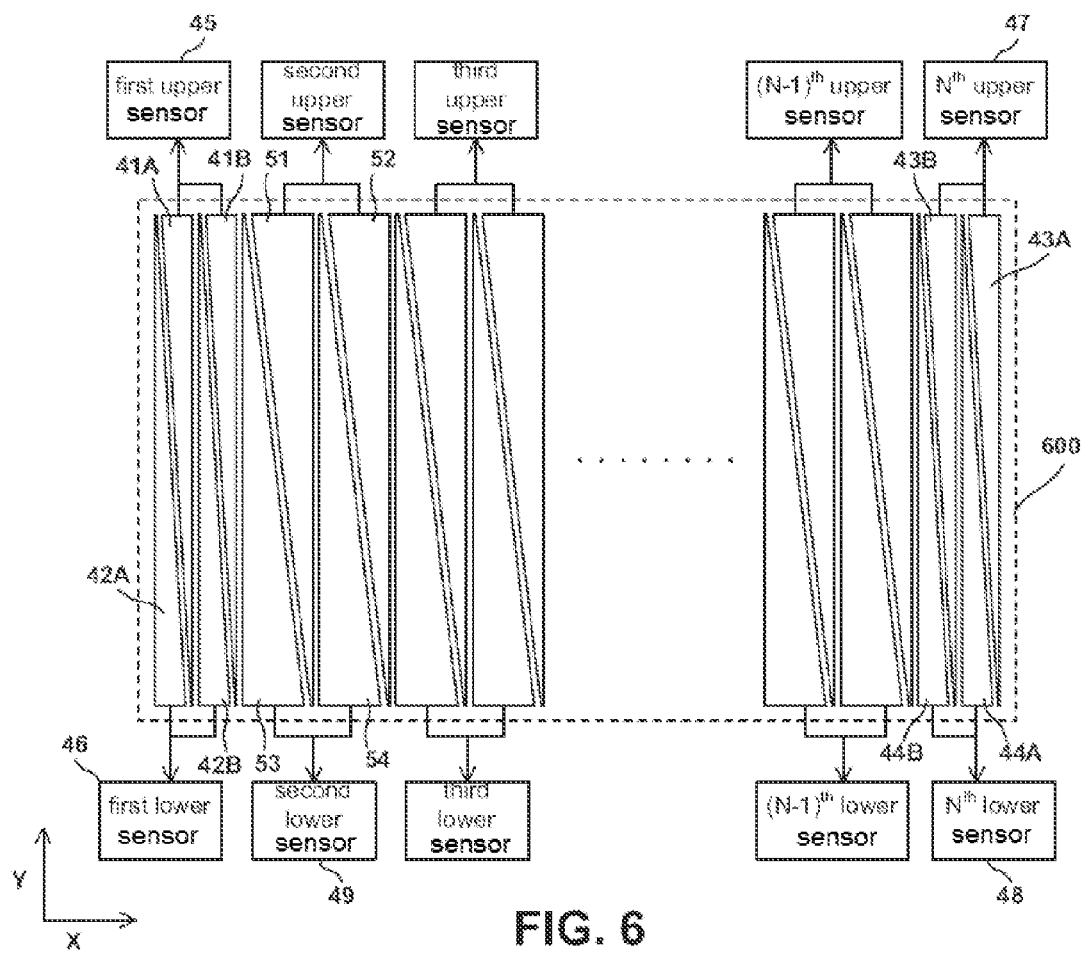
FIG. 6 an exemplary electrode/sensor arrangement according to an embodiment of the present invention.

According to another embodiment of the present invention, a self-capacitive touch panel is provided in FIG. 6. FIG. 6 shows a function block diagram of the self-capacitive touch panel according to this embodiment. Referring to FIG. 6, in a sensing area 600, four leftmost border electrodes 41A, 41B, 42A and 42B, as well as four rightmost border electrodes 43A, 43B, 44A and 44B, are narrower than other electrodes (e.g., electrodes 51, 52, 53 and 54) in a central region. In this embodiment, a first upper sensor 45 is shared by the electrodes 41A and 41B, a first lower sensor 46 is shared by the electrodes 42A and 42B, an N$^{th}$ upper sensor is shared by the electrodes 43A and 43B, and an N$^{th}$ lower sensor is shared by the electrodes 44A and 44B. For other wider electrodes in the central region, one sensor is similarly shared by two electrodes. The self-capacitive touch panel may further include a controller (not shown) for determining a touch position according to sensing results of the sensors.

Figure 7:
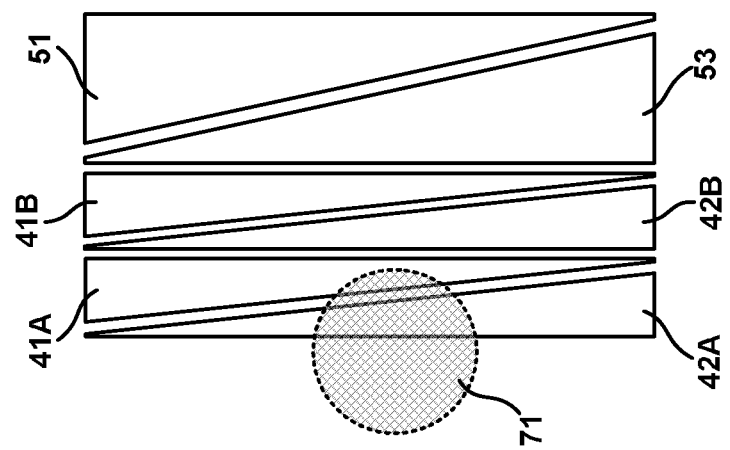
FIG. 7 is for explaining details for enhancing positioning accuracy according to the embodiment.

With reference to the electrodes 41A, 41B, 42A, 42B, 51 and 53 again depicted in FIG. 7, details for obtaining preferred accuracy in the sensing results of the border regions according to the embodiment over the prior art are explained below. When a user touch takes places at a position within a dotted circle 71 (the position of the circle 21 in FIG. 3A) in FIG. 7, similar to the situation in FIG. 5, sensing results generated by the first upper sensor 45 and the first lower sensor 46 are both provided for calculating the Y coordinate of the circle 71, and so a more accurate coordinate y is obtained.

Figure 8:
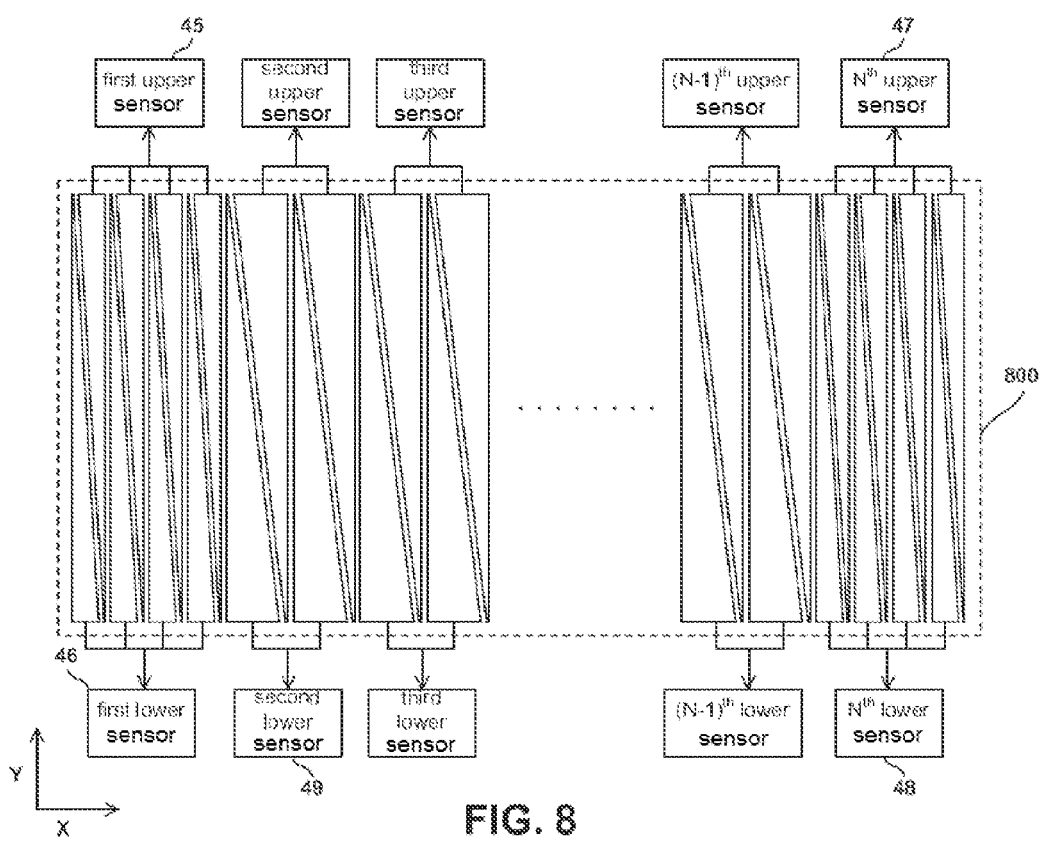
FIG. 8 an exemplary electrode/sensor arrangement according to an embodiment of the present invention.

According to yet another embodiment of the present invention, a self-capacitive touch panel is provided. FIG. 8 shows a function block diagram of the self-capacitive touch panel according to this embodiment. Referring to FIG. 8, in a sensing area 800, eight leftmost border electrodes as well as eight rightmost border electrodes are narrower than other electrodes in a central region. As seen from the diagram, in this embodiment, a first upper sensor 45 is shared by four of the leftmost border electrodes, a first lower sensor 46 is shared by the other four leftmost border electrodes, an N$^{th}$ upper sensor 47 is shared by four of the rightmost electrodes, and an N$^{th}$ lower sensor is shared by the other four rightmost electrodes. For other wider electrodes in the central region, one sensor is similarly shared by two electrodes. Similar to the embodiment in FIG. 6, the narrower border electrodes in FIG. 8 increase the possibility that the two capacitance changes $C_U$ and $C_D$ are non-zero values, so that a more accurate coordinate y can be obtained.

It is seen from the above embodiments that, under the premise that two capacitance changes $C_U$ and $C_D$ in non-zero values can be simultaneously triggered by a user touch, a more accurate coordinate y can be obtained than in a situation where only one capacitance change (one of $C_U$ and $C_D$) is available. Therefore, a principle of the present invention is to increase the number of sensors that may be triggered when a user touches a border region of a touch panel. In practice, under the condition that the area touched by a user remains unchanged, by increasing the number of sensors corresponding to a unit area or increasing the number of electrodes covered in a unit area, the number of sensors that may be triggered by a user touch can be increased.

FIG. 4 and FIG. 6 show embodiments of increased numbers of sensors corresponding to a unit area. With respect to FIG. 4 for example, when the width of the electrode 41 is half of that of the electrode 51, the number of sensors corresponding to a unit area within the border region is four times of the number of sensors corresponding to a unit area within the central region. With respect to FIG. 6, when the widths of the electrodes 41A and 42B are half of that of the electrode 51, the number of sensors corresponding to a unit area within the border region is twice of the number of sensors corresponding to a unit area within the central region. It should be noted that, in the prior art (e.g., in FIG. 1), the number of sensors corresponding to a unit area within the border region is the same as the number of sensors corresponding to a unit area within the central region. In conclusion, assume that a border region of a touch panel has a first area corresponding to a P number of sensors, and a central region has a second area corresponding to a Q number of sensors. According to the solution of the present invention, a ratio of P to the first area is greater than a ratio of Q to the second area, so that the accuracy of the coordinate y is enhanced.

FIG. 8 shows an embodiment of an increased number of electrodes covered within a unit area. With respect to FIG. 8, the number of sensors corresponding to a unit area of the border region and the central region are equal. However, the number of electrodes (four electrodes) corresponding to each sensor in the border region is greater than the number of electrodes (two electrodes) corresponding to each sensor in the central area. That is to say, assume that a unit area within a border region of a touch panel includes an R number of electrodes corresponding to a P number of sensors, and a unit area within a central region of includes an M number of electrodes corresponding to a Q number of sensors. According to another solution of the present invention, a ratio of R to P is greater than a ratio of M to Q, so that the accuracy of the coordinate y is enhanced. It should be noted that, the electrodes connected to the same sensor may be physically in direct connection, and may also be connected at a connecting end of the sensor.

With the embodiments of the present invention, it is also demonstrated that, a more accurate coordinate x can be obtained by changing a position of a center of gravity corresponding to a sensor in a border region. With respect FIG. 4, an average distance between the border electrode 41 and all possible touch points in the border electrode 41 is designed to be smaller than an average distance between the common center of gravity of the central electrodes 51 and 52 and all possible touch points in the central electrodes 51 and 52. With respect to FIG. 6, an average distance between the common center of gravity of the border electrodes 41A and 41B and all possible touch points in the border electrodes 41A and 41B is similarly designed to be smaller than an average distance between the common center of gravity of the central electrodes 51 and 52 and all possible touch points in the central electrodes 51 and 52.

It can be easily appreciated that, implementations of the concepts of the above embodiments are not limited to the above electrode shapes and electrode arrangements. For example, regardless of whether the electrodes are triangles, a user touch position can be more accurately determined given that the number of non-zero output signals simultaneously triggered by a user touch is increased.

In conclusion, in a self-capacitive touch panel provided by the invention, compared to the prior at, the accuracy in a coordinate y can be enhanced by increasing the number of sensors that may be triggered when a user presses a border region, and the accuracy in a coordinate x can be enhanced by changing a position of a center of gravity corresponding to a sensor in a border region.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A self-capacitive touch panel, comprising: a plurality of sensors; a border region, wherein each unit area of the border region comprises an R number of electrodes corresponding to a P number of first sensors among the plurality of sensors; and a central region, wherein each unit area of the central region comprises an M number of electrodes corresponding to a Q number of second sensors among the plurality of sensors; wherein, a ratio of R to P is greater than a ratio of M to Q, wherein R and M are integers greater than 1, each of the P number of first sensors corresponds a plurality of first electrodes among the R number of electrodes, the plurality of first electrodes have a first center of gravity, each of the Q number of second sensors corresponds to a plurality of second electrodes among the M number of electrodes, and the plurality of second electrodes have a second center of gravity; a first average distance between the first center of gravity and all possible touch points in the plurality first electrodes is smaller than a second average distance between the second center of gravity and all possible touch points in the plurality of second electrodes.

2. The self-capacitive touch panel according to claim 1, wherein a planar shape of the plurality of first electrodes approximates a first right triangle, a planar shape of the plurality of second electrodes approximates a second right triangle, a shortest side of the first right triangle is shorter than a shortest side of the second right triangle, and a second shortest side of the first right triangle is equal to a second shortest side of the second right triangle.

* * * * *